(12) United States Patent
Campbell

(10) Patent No.: US 6,327,168 B1
(45) Date of Patent: Dec. 4, 2001

(54) SINGLE-SOURCE OR SINGLE-DESTINATION SIGNAL ROUTING THROUGH IDENTICAL ELECTRONICS MODULE

(75) Inventor: David Charles Campbell, Chandler, AZ (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/692,274

(22) Filed: Oct. 19, 2000

(51) Int. Cl.[7] ................................ G11C 5/02; H05K 7/02
(52) U.S. Cl. .................. 365/51; 365/63; 365/52; 361/736; 361/760; 361/777; 361/790; 361/803
(58) Field of Search .................... 365/51, 52, 63; 361/730, 761, 777, 790, 803

(56) References Cited

U.S. PATENT DOCUMENTS

| | | | |
|---|---|---|---|
| 5,629,838 | * 5/1997 | Knight et al. ................ | 361/782 |
| 6,016,256 | * 1/2000 | Crane, Jr. et al. ............ | 361/813 |
| 6,049,467 | * 4/2000 | Tamarkin et al. ............ | 361/790 |
| 6,072,699 | * 6/2000 | Horine ........................ | 361/777 |
| 6,097,619 | * 8/2000 | Nguyen et al. ............... | 365/63 |
| 6,144,576 | * 11/2000 | Leddige et al. ............... | 365/63 |
| 6,148,363 | * 11/2000 | Lofgren et al. .............. | 711/103 |
| 6,160,716 | * 12/2000 | Perino et al. ................ | 361/185 |
| 6,172,895 | * 1/2001 | Brown et al. ................ | 365/63 |
| 6,218,201 | * 4/2001 | Plangger et al. ............. | 438/15 |

* cited by examiner

Primary Examiner—Viet Q. Nguyen
(74) Attorney, Agent, or Firm—Jeff D. Limon; Kevin D. Wills

(57) ABSTRACT

This abstract is being provided in accordance with the provisions of Section 1.72 of the Rules of Practice in Patent and Trademark Cases (37 CFR). The applicant intends that this abstract be used only to aid in determining the general nature of the technical disclosure. The applicant does not intend that this abstract be looked to in order to aid or assist in the determination of the scope of any claim.

An electronic module (FIG. 1, 100) includes an upper portion (135) and lower portion (130) of a connector (110) which allows the electronics module to attach to both a second, identical electronics module (200) as well as to motherboard (10). Signals which are intended to terminate on the electronic module (100) are routed directly to the appropriate component (120) on the module. Signals intended for a similar component (220) located on the second, identical electronics module are routed such that each signal can be received by the second, identical electronics module (200) at the location that corresponds to the location where the signal was input to the first module (100).

3 Claims, 2 Drawing Sheets

SINGLE-SOURCE OR SINGLE-DESTINATION SIGNAL ROUTING THROUGH IDENTICAL ELECTRONICS MODULE

FIELD OF THE INVENTION

The invention pertains generally to the field of electronics and, more particularly, to signal routing through electronics modules.

BACKGROUND OF THE INVENTION

In complex electronic systems, where multiple electronics modules are used in order to provide the necessary flexibility and functionality of the system, the design of each individual module may be unique. For each unique module, manufacturers and customers must constantly track, control, and maintain configurations for the module in order to ensure that replacement parts are available when failures within the electronic modules occur in the field. Thus, manufacturers and customers continually strive to reduce the number of the different configurations of manufactured and fielded electronic modules in order to reduce cost and improve the availability of an electronics systems constituent modules.

When two or more memory mezzanine modules are stacked one atop the other on a motherboard, signals which are intended to terminate at a single destination, as well as signals which originate from a single source, must be routed through at least one intervening module to the motherboard. However, this often requires that each board be unique in order to receive the appropriate single-destination signals from an adjacent module as well as to provide single-source signals to an adjacent module.

Thus, it is highly desirable to make use of identical modules in designs which employ single-source and single-destination signals. These reduces the number of modules that manufacturers and customers must track, control, and maintain in order to ensure that replacement parts are available when failures within the electronic modules occur in the field.

BRIEF DESCRIPTION OF THE DRAWINGS

The invention is pointed out with particularity in the appended claims. However, a more complete understanding of the invention may be derived by reading the specification herein in conjunction with the figures wherein like reference numbers refer to like components, and:

DESCRIPTION OF THE PREFERRED EMBODIMENT

Single-source or single-destination signal routing through identical electronics modules allows certain types of electronics modules to be constructed using identical interfaces while allowing signals to be independently routed through the electronics modules. This allows manufacturers and customers to maintain fewer module configurations without jeopardizing functionality or reliability of the electronics modules.

Figure 1:
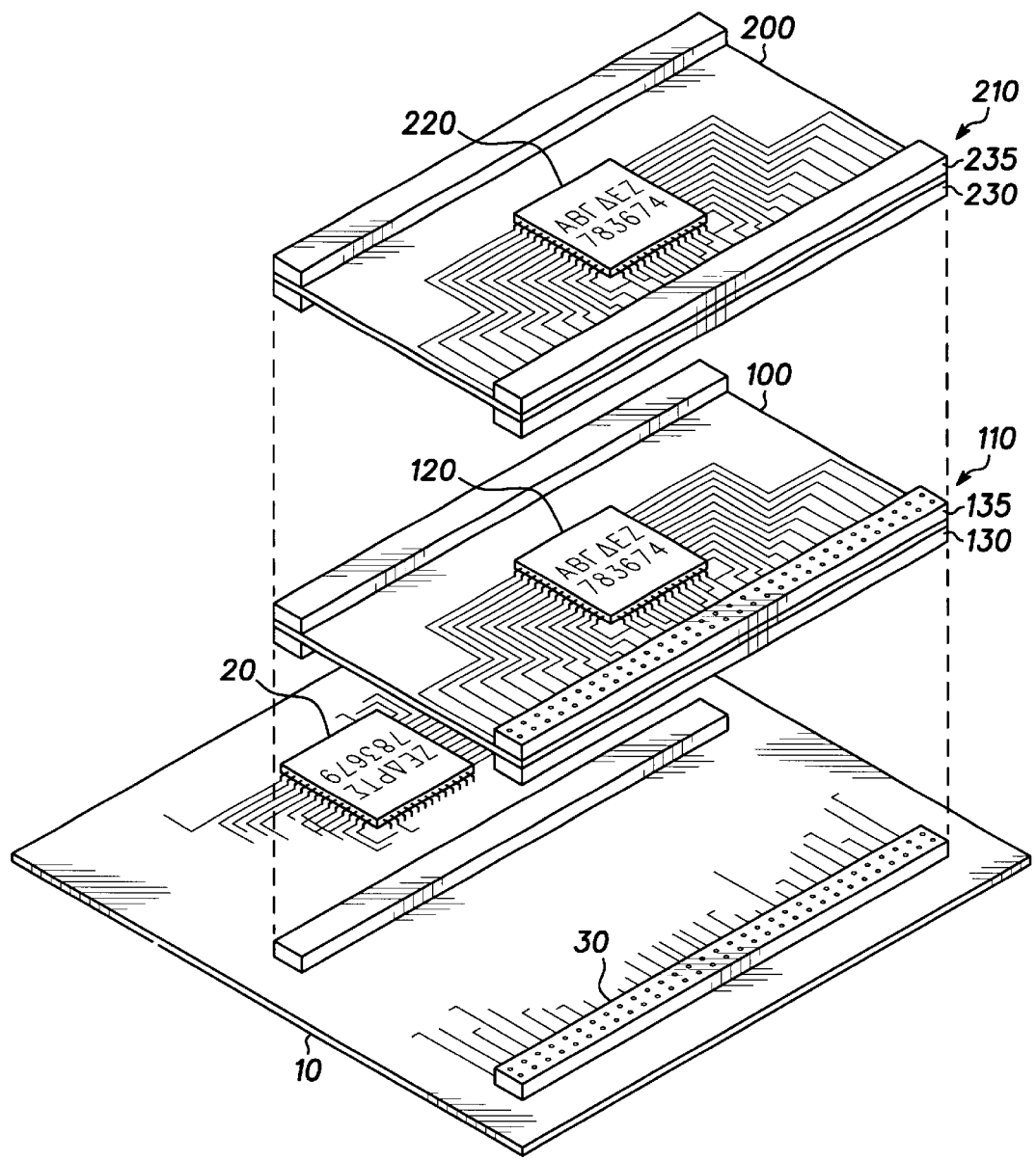
FIG. 1 is an isometric view of two electronics modules which are intended to be affixed to each other and to a common motherboard in accordance with a preferred embodiment of the invention.

FIG. 1 is an isometric view of two electronics modules which are intended to be affixed to each other and to a common motherboard in accordance with a preferred embodiment of the invention. In FIG. 1, motherboard 10 incorporates motherboard connector 30. Motherboard 10 further includes a variety of electronic components, such as component 20, which may represent a central processing unit, memory management unit, clock, analog device, or other conventional electronic component. Motherboard connector 30 is intended to mate with lower portion 130 of module connector 110 of electronic module 100. Component 120, affixed to electronic module 100, can represent any type of electronic component in a manner similar to component 20 of motherboard 10.

In the example of FIG. 1, electronic module 200 is affixed to electronic module 100 by way of lower portion 230 of module connector 210 which connects to upper portion 135 of connector 110. Electronic module 200 includes component 220 which can be capable of performing functions similar to components 120 and 20. Thus, through the mating of connectors present on electronic modules 200 and 100, these modules can be affixed to motherboard 10 and provide additional functionality to motherboard 10 such as providing additional memory, additional processing resources, or can otherwise enhance the functionality of motherboard 10.

It is noteworthy that although only two modules are shown in FIG. 1, the present invention is not restricted to the use of two memory modules stacked one atop the other. In alternate embodiments, a greater number of electronic modules may be used. Additionally, nothing prevents the use of electronic modules which are not stacked but are arranged in a manner other than shown in FIG. 1, such as side-by-side or end-to-end. Further, although connectors 30, 110 and 210 are each shown as being a flat, rectangular connectors, nothing the prevents the use of a greater number of connectors with one or more connectors being arranged in a different geometry such as rectangular or circular.

In FIG. 1, it is anticipated that electronic modules 100 and 200 are substantially identical to each other. Thus, motherboard connector 30 can mate with lower portion 230 of module connectors 210 of electronic module 200, instead of mating with lower portion 130 of connector 110 as shown. It is further anticipated that components 120 and 220 are the sole recipients of at least one electronic signal. In other words, components 120 and 220 each receive at least one signal specifically intended for use by each component and not for use by another component on electronic modules 100 and 200.

Signals intended for component 120 are routed from motherboard 10 through motherboard connector 30 and through electronic module connector 110 to component 120. Meanwhile, signals intended for component 220 are routed through motherboard connector 30 in order to be present at a location on upper portion 135 that corresponds to the location of the signals on motherboard connector 30 which are intended for component 120. These signals can continue onward to electronic module 200 by way of connector 210. Thus, electronic module 100 "swivels" those single-destination signals intended for component 220 in order to provide those signals at locations on upper portion 135 that correspond to the locations of signals intended for component 120 on motherboard connector 30. The swiveling function enables electronic modules 100 and 200 to be constructed identically.

In a similar manner, components 120 and 220 may provide a single source of a particular electronic signal for use by motherboard 10. Thus, component 220 and 120 may generate signals which are the result of a built-in-test for at least a portion of electronics module 100 and 200 (respectively) that are intended to propagate from each component through the appropriate connectors to motherboard 10. Those signals which originate on components 120 and 220 can then be presented at corresponding locations on lower portions 230 and 130, respectively. Module 100 swivels those signals which originate at component 220 to locations other than those locations used by the signals from component 120 in order to allow the use of these locations by the signals from component 120.

Figure 2:
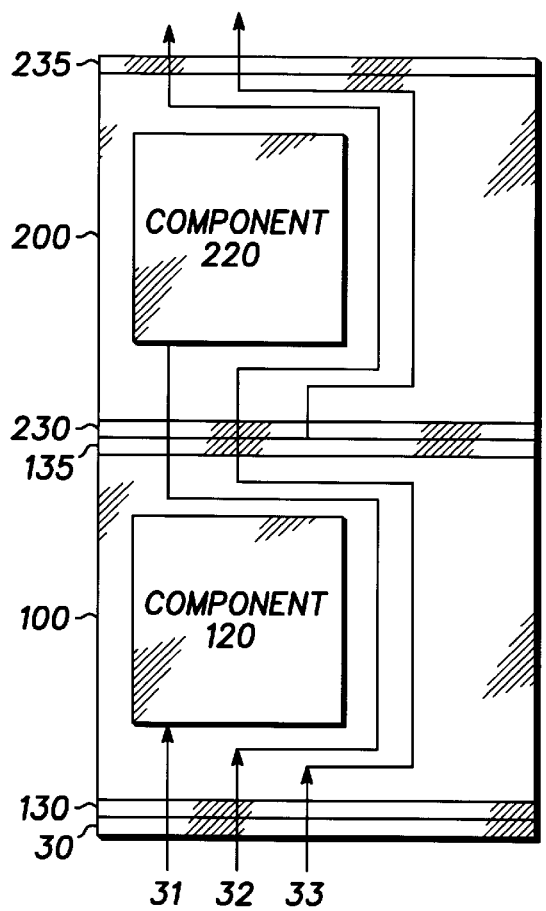
FIG. 2 is a block diagram of identical electronic modules which incorporate single-source or single-destination signal routing in accordance with a preferred embodiment of the invention.

FIG. 2 is a block diagram of identical electronic modules which incorporate single-source or single-destination signal routing in accordance with a preferred embodiment of the invention. In FIG. 2, components 120 and 220 are shown as being included within electronic modules 100 and 200 respectively. Additionally, module connector 110 has been split in order to indicate signal routing from motherboard connector 30 through lower portion 130 to upper portion 135. Further, module connector 210 has been split in order to indicate signal routing through lower portion 230 and upper portion 235.

In FIG. 2, signal 31 is conveyed through motherboard connector 30 through lower portion 130 to component 120. Additionally, signal 32 is conveyed through motherboard connector 30 through lower portion 130 across electronics module 100 to upper portion 135. Signal 32 can then be presented to lower portion 230 of module 200 at a location which corresponds to the location of signal 31 on motherboard connector 30. With signal 32 present at this location, module 200 can route signal 32 to component 220 in the same manner as electronic module 100 routes signal 31 to component 120. In the example of FIG. 2, signals 31, and 32 can represent any type of signal, such as discrete, serial digital, analog, or clock signal.

In a complementary manner, signal 33 can be presented to module 200 in a location on upper portion 135 that corresponds to the location of signal 32 of motherboard connector 30. Therefore, signal 33 may be routed by way of module 200 in a manner corresponding to the routing of signal 32 by way of module 100. Signal 33 can then be presented to a third module (not shown) which is beyond upper portion 235 and can terminate on a component on the third module that corresponds to component 120 of module 100.

Through this technique of recursively routing signals, each module (such as modules 100 and 200) can be constructed identically while still providing access to single-destination components located on subsequent modules. Further, signals transmitted from component 220 can be routed to be present on a particular output of each module. Thus, in the event that components 220 and 120 are reporting data such as built-in-test results, this information can be propagated across a plurality of modules and be present at motherboard connector 30.

Figure 3:
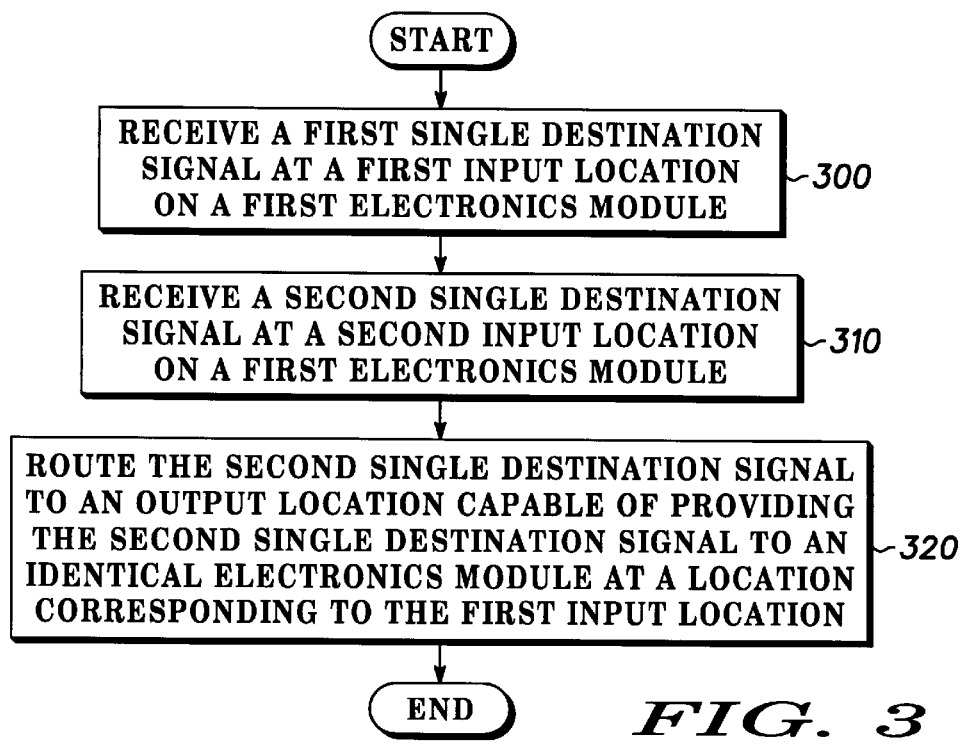
FIG. 3 is a flowchart for a method for single-destination signal routing within an electronics module in accordance with a preferred embodiment of the invention.

FIG. 3 is a flowchart of a method for single-destination signal routing within an electronics module in accordance with a preferred embodiment of the invention. The apparatus of FIG. 2 is suitable for performing the method of FIG. 3. The method begins at step 300 where a first single-destination signal is received at a first input location. Desirably, the first single-destination signal is intended to terminate on the electronics module. At step 300, the electronics module receives a second single-destination signal by way of a second input. In step 300, the second single-destination signal is not intended to terminate on the electronics module, but rather is intended to terminate on a subsequent electronics module. The method continues at step 310, where the second single-destination signal is output to a location capable of providing the second single-destination signal to a second electronics module. Preferably, this location is commensurate with the location at which the electronics module received the first single-destination signal. The method continues at step 320 where the second single-destination signal is routed to an output location capable of providing the signal to an identical electronics module at a location that corresponds to the first input location.

In conclusion, single-source or single-destination signal routing through identical electronics modules allows certain types of electronics modules to be constructed using identical interfaces while allowing signals to be independently routed through the electronics modules. This allows manufacturers and customers to maintain fewer module configurations without jeopardizing functionality or reliability of the electronics modules.

Accordingly, it is intended by the appended claims to cover all modifications of the invention that fall within the true spirit and scope of the invention.

What is claimed is:

1. In an electronics module, a method for single-destination signal routing within said electronics module, comprising:

receiving a first single-destination signal at a first input location, said first single-destination signal terminating on said electronics module;

receiving a second single-destination signal at a second input location, said second single-destination signal not intended to terminate on said electronics module; and routing said second single-destination signal to an output location capable of providing said second single-destination signal to a second electronics module substantially identical to said electronics module and having an input which accepts said second single-destination signal at said output location, wherein said output location corresponds to said first input location on said electronics module; wherein said first and second single-destination signals are used to initiate a process on said electronics module and said second electronics module, and wherein said process is built-in-test of at least a portion of said electronics module and said second electronics module.

2. An electronics module which routes a single-destination signal from an input to an output, comprising:

a first signal input for receiving a first single-destination signal, said first single-destination signal being intended for a component on said electronics module;

a second signal input for receiving a second single-destination signal, said second single-destination signal being intended for a second component located on a second electronics module wherein said second electronics module is substantially identical to said first electronics module; and a first output configured to provide said second single-destination signal to said second electronics module at a location on said second electronics module corresponding to said first signal input, wherein said first and second single-destination signals are used to initiate a process on said electronics module and said second electronics module, and wherein said process is built-in-test of at least one component of said electronics module.

3. In a modular system, wherein a first and second modules are substantially identical, a method for signal routing on said first and second modules, comprising:

a first component on said first module generating a first signal, said first signal being output at a first location on said first module;

a second component on said second module generating a second signal, said second signal being output at a location on said second module which corresponds to said first location on said first module; and said first module accepting said second signal and routing said second signal to be output to a second location on said first module, wherein said first and second signals convey built-in-test results.

* * * * *